(12) United States Patent
Bakke et al.

(10) Patent No.: US 7,396,740 B2
(45) Date of Patent: Jul. 8, 2008

(54) METHOD OF PRODUCING A DEVICE WITH A MOVABLE PORTION

(75) Inventors: Thor Bakke, Dresden (DE); Martin Friedrichs, Dresden (DE); Benjamin Völker, Dresden (DE); Thomas Haase, Dresden (DE)

(73) Assignee: Frauhofer-Gesellschaft zur Foerderung der Angewandten Forschung E.V., Munich (DE)

( * ) Notice: Subject to any disclaimer, the term of this patent is extended or adjusted under 35 U.S.C. 154(b) by 194 days.

(21) Appl. No.: 11/336,267

(22) Filed: Jan. 20, 2006

(65) Prior Publication Data

US 2006/0166463 A1   Jul. 27, 2006

(30) Foreign Application Priority Data

Jan. 21, 2005   (DE)   ........................ 10 2005 002 967

(51) Int. Cl.
*H01L 21/30* (2006.01)
*H01L 21/311* (2006.01)
*H01L 21/316* (2006.01)

(52) U.S. Cl. ........................ 438/455; 438/52; 438/456

(58) Field of Classification Search ................. 438/455, 438/456, 48, 52
See application file for complete search history.

(56) References Cited

U.S. PATENT DOCUMENTS 5,003,062 A   3/1991 Yen (Continued)

FOREIGN PATENT DOCUMENTS

CN   1314706 A   9/2001

(Continued)

OTHER PUBLICATIONS

Journal of Microelectromechanical Systems, vol. 12, No. 4, Aug. 2003, "Arrays of Monocrystalline Silicon Micromirrors Fabricated Using CMOS Compatible Transfer Bonding", pp. 465-469.

(Continued)

*Primary Examiner*—M. Wilczewski
(74) *Attorney, Agent, or Firm*—Laurence A. Greenberg; Werner H. Stemer; Ralph E. Locher

(57) ABSTRACT

A method of producing a device with a movable portion spaced apart from a support wafer comprises a step of providing the support wafer having a structured surface and a further step of providing a device wafer with a backing layer and a device layer disposed thereon. Further, the method comprises the step of generating a first planarization layer from a first starting material on the support wafer with a first method to fill in the structures of the structured surface of the support wafer, whereby a surface with a first degree of planarization is obtained. Further, the method comprises a step of generating a second planarization layer from a second starting material on the planarized surface of the support wafer with a second method to obtain a surface with a second degree of planarization, which is higher than the first degree of planarization, wherein the first and second planarization layers can be removed together. Additionally, the support wafer is connected to the device wafer such that the device layer and the planarized surface of the support wafer are connected. Then, removing the backing layer of the device wafer is performed, followed by structuring the resulting structure and removing the first and second planarization layers via a common method to generate the moveable portion of the device.

14 Claims, 16 Drawing Sheets

U.S. PATENT DOCUMENTS

| | | |
|---|---|---|
| 6,417,073 B2 | 7/2002 | Watanbe |
| 7,060,521 B2 * | 6/2006 | Leonardsson ................ 438/52 |
| 7,075,160 B2 * | 7/2006 | Partridge et al. ............ 257/414 |
| 7,214,625 B2 * | 5/2007 | Asami et al. ................ 438/719 |
| 2001/0026994 A1 | 10/2001 | Watanbe |
| 2004/0065931 A1 * | 4/2004 | Benzel et al. ............... 257/414 |
| 2005/0002596 A1 | 1/2005 | Leonardsson |
| 2006/0008936 A1 * | 1/2006 | Asai ............................ 438/50 |
| 2006/0274074 A1 * | 12/2006 | Miles ......................... 345/540 |
| 2007/0041076 A1 * | 2/2007 | Zhong et al. ................ 359/290 |
| 2007/0194630 A1 * | 8/2007 | Mignard et al. ............... 310/10 |
| 2007/0196998 A1 * | 8/2007 | Foster et al. ................ 438/456 |

FOREIGN PATENT DOCUMENTS

WO          WO 03/025986 A1      3/2003

OTHER PUBLICATIONS

Dauderstadt, U., et al.; "Application of Spatial Light Modulators for Microlithography", MOEMS Display and Imaging Systems II: Jan. 26-27, 2004, San Jose, CA, USA, Bellingham, WA: SPIE, 2004, pp. 119-126.

* cited by examiner

METHOD OF PRODUCING A DEVICE WITH A MOVABLE PORTION

CROSS-REFERENCE TO RELATED APPLICATION

This application claims priority from German Patent Application No. 102005002967.1, which was filed on Jan. 21, 2005 and is incorporated herein by reference in its entirety.

BACKGROUND OF THE INVENTION

1. Field of the Invention

The present invention relates to the technical field of micro optoelectromechanical devices (MOEMS devices) and particularly, the present invention relates to the technical partial field of spatial light modulators on a semiconductor wafer.

2. Description of the Related Art

Spatial light modulators, also referred to as SLM, which are based on micromirrors for optical lithographic applications, require an exceptionally high mirror planarity to provide a tool having a high lithographic resolution and a dimensional or scalar uniformity. The conventional and currently used SLM technology based on aluminum mirrors has certain limitations or constraints in this regard. This technology is based on producing micromirrors on the top face of CMOS control electronics (CMOS=complementary metal oxide semiconductor) by using techniques for surface microprocessing (see also "Application of Spatial Light Modulator for Microlithography" by U. Dauderstädt, P. Dürr, T. Karlin, H. Schenk, H. Lakner, Proceedings of SPIE, vol. 5348, pp. 119-126, 2004). The reasons for limited planarity are:

a) The sacrificial layer comprises a polymer, which is also used to planarize the CMOS wafer and which works as spacer between the mirrors and the actuation electrodes. The planarization or leveling is achieved by chemical mechanical polishing (CMP) of the polymer, which removes residual surface roughness and levels out height differences on the wafer surface. The local planarity, which can be achieved is limited to a few nanometers. The mirror material is then sputtered directly onto the polymer sacrificial layer and any non-planarity in the spacer is directly transferred to the mirrors.

b) The mirror material is an aluminum alloy, having a grain structure with a grain structure in the range of several tens up to hundreds of nanometers. The grain structure is determined by the sputter conditions, such as sputter rate, pressure or temperature, as well as by the physical properties of the material on which sputtering is performed. Although it is possible to obtain a fairly homogeneous thin film with minor stress gradients, the alloy is subject to re-crystallization and stress relaxation upon heating and also sensitive to mismatch in contrast to the surrounding material, such as the spacer, during thermal expansion. The morphology of an aluminum alloy thin film can easily change as a result of changing processing conditions. Small changes in the crystal structure lead to stress gradients in the thin film that easily warps of deforms a micromirror made out of such an alloy. Thereby, it is extremely difficult to obtain a good mirror planarity. The statistical nature of the material itself as well as changes in the process conditions inevitably lead to a limited reproducibility and also, to a certain amount, to a dependency on a statistical spread of the planarity, so that it is impossible to perform an exact control and reproducibility of the planarity. For every large-area matrix-shaped spatial light modulator, a good matrix uniformity is of vital importance. Otherwise, the wafer-to-wafer and run-to-run reproducibility is limited. Further, an aluminum alloy is susceptible to plastic deformation upon bending. In that way, the mirror planarity can change during use, which limits the life span of such an SLM.

A first approach for solving one of the above-mentioned problems could be the usage of monocrystalline silicon. Monocrystalline silicon is completely insensitive to processing temperature and has a coefficient of thermal expansion that is well matched to the rest of a CMOS wafer. It is possible to form micromirrors out of this material with a mirror planarity which is merely limited by the polishing quality of silicon, which is possible up to the range of atomic layers by using current techniques. Monocrystalline silicon is perfectly elastic and thus insensitive to plastic deformation upon use. Thus, the life time of the SLMs is not limited by material properties.

The idea of using monocrystalline silicon for producing spatial light modulators is not new. In the prior art, "flip chip" bonding of a structured micromirror on a wafer is disclosed, which comprises control electronics (see, for example, U.S. Pat. No. 6,587,613 B1, U.S. Pat. No. 6,800,210 B2 or U.S. Pat. No. 6,798,561 B2). These methods are based on separate fabrication of mirror structure (MEMS=micro-electromechanical systems) and control electronics (in CMOS technology). Then, the MEMS and CMOS are integrated by using an unspecified bonding method to join the two structures, which can either be performed on chip or wafer level. Another proposed method is based on a layer transfer of a monocrystalline thin film from a donor wafer, also referred to as SOI (SOI=silicon on insulator), onto a wafer containing control electronics, which can either be performed by eutectic bonding (for example according to WO 03/068669 A1) or by adhesive bonding (see, for example "Arrays of Monocrystalline Silicon Micromirrors Fabricated Using CMOS Compatible Transfer Bonding", F. Niklaus, S. Haasl and E. Stemme, Journal of Micro-electromechanical Systems, vol. 12, no. 4, August 2003, pp. 465-469). A particular requirement for conventional spatial light modulators is the thickness of the mirrors, which should be in the range of 300 nanometers or less. However, up to now, such thin silicon membranes has not been successfully bonded to CMOS wafer, and thus the prior art has clear limits.

Further, the following disadvantages are to be mentioned concerning the prior art:

With regard to "flip chip" bonding of structured micromirrors (U.S. Pat. No. 6,587,613 B1, U.S. Pat. No. 6,800,210 B2 or U.S. Pat. No. 6,798,561 B2) it has to be said that this bonding requires a highly accurate alignment of the mirror structure with regard to the control electronics and that further the conditions for alignment accuracy increase rapidly with reduction of the pixel size, thus the method has limited scalability.

With regard to the layer transfer of monocrystalline silicon by eutectic bonding (WO 03/068669 A1) it has to be mentioned that this bonding of the wafers is based on forming an eutectic gold silicon alloy, which requires temperatures in excess of 363° Celsius and thus means a risk for increased stress in the transferred film. A further disadvantage is that an indiffusion of gold has to be performed, which can affect the mechanical performance of nearby elements, such as mirror hinges. Additionally, locally limited stress can be built up and crystal defects can occur at the bonded areas, which are sources for crack formation during thinning down. This is particularly a problem when very thin films, such as are required for spatial light modulators, have to be bonded.

While this method of eutectic bonding has the advantage of being able to produce electrical and mechanical connections between mirrors and electronics directly without further processing (i.e. no filling elements are used), there is a disadvantage in that the area where bonding is performed is limited and in direct conflict to the requirement for compact post structures. A high mirror fill factor, which, on the one hand, requires small posts or plugs, respectively, and, on the other hand, a maximum bond area for ensuring a sufficient membrane integrity, requires thus two bonds which are mutually exclusive. Further, it has to be mentioned about eutectic bonding that it requires that a contact between post and film is achieved on all locations on the film, which is, however, very difficult, since a) there are slight variations of the post heights, and
b) the mating wafers (i.e. the SOI wafer and the wafer providing the control electronics) have variations in thickness.

Thereby, the difficulty is the strength of the wafers and the structures on the wafers, whereby bonding becomes sensitive to local height variations.

In relation to a layer transfer of a monocrystalline silicon by adhesive bonding (according to the above-mentioned disclosure of F. Niklaus, S. Haasl and G. Stemme) it has to be mentioned that this adhesive bonding has a limited bonding strength, caused by the dependence of the adhesive capability of the used adhesive material. Thus, the adhesive capability is highly dependent on the used material and thus at the same for all structures on the wafer. Additionally, it has to be mentioned that a thickness of a coating polymer is highly sensitive to a heavily structured surface topology. As long as no specific precautions are taken, the gap between the bonded wafers will be non-uniform and structure-dependent. Differences in the gaps between the mirrors and electrodes lead to variations in deflection properties.

Further, it is a disadvantage of adhesive bonding that outgassing can occur during bonding, which leads to the formation of bubbles. This problem of outgassing can be mitigated by bonding under vacuum, which requires a significant overhead by processing under vacuum. Further, it has to be mentioned that there is a risk of particle contamination prior to bonding caused by the lack of suitable bonding tools allowing cleaning immediately prior to bonding as a partial step of the bonding process. Further, it is a disadvantage of adhesive bonding that temperature limitations occur due to material instability, such as material flow or decomposition at elevated temperatures, which might exclude the usage of W-CVD (W-CVD=tungsten based chemical vapor deposition) for forming the planar surface after bonding. Further, it has to be mentioned that non-ideal material properties, such as sodium contamination of certain polymers cause incompatibility with CMOS electronics or with standard microfabrication processes.

Further, WO 03/025986 A1 discloses a bonding method, where the contact posts are formed between the mirror membrane and electrodes after bonding. This patent application discloses, in a general way, method steps required for a successful fabrication of actual SLM devices. However, the fabrication method described herein can be further improved in several aspects, since merely a general list of different generally possible methods is disclosed and only little specific information about the processing conditions is mentioned. For example, the claims include all possible ways of bonding substrates. In this patent application, particularly basic processing conditions for bonding with an adhesive material, such as a photoresist, are disclosed (page 9 of WO 03/025986 A1). Further, the above-mentioned patent application remains non-specific about how a thin film is to be deposited on the electronic substrate. Additionally, no direct information is given on how this is to be performed particularly with a monocrystalline silicon thin film. The disclosure in the above-mentioned patent application that thinning down of part of the silicon wafer can be performed (such as disclosed on page 3 and 7 of the mentioned patent application), would cause problems when the goal is a 300 nm thick membrane, since the accuracy of such a process is very poor. Further, in the above-mentioned patent application, it is described very generally how the connection of the electrical/mechanical connections between the silicon membrane and the electronics can be made. Additionally, in the above-mentioned patent application, it is only discussed very generally that the bonding material has to be removed in order to make the micromirrors moveable. However, it is not discussed anywhere how this could be performed.

SUMMARY OF THE INVENTION

It is an object of the present invention to provide a method of producing a spatial light modulator, which has clearly improved properties compared to conventional methods. Further, an inexpensive possibility for producing such a spatial light modulator is to be provided.

The present invention provides a method of producing a device with a moveable portion disposed spaced apart from a support wafer, having the steps of: providing a support wafer having a structured surface; providing a device wafer with a backing layer and a device layer disposed thereon; generating a first planarization layer from a first starting material on the support wafer with a first method to fill in the structures of the structured surface of the support wafer, whereby a surface with a first degree of planarization is obtained; generating a second planarization layer from a second starting material on the planarized surface of the support wafer with a second method to obtain a surface with a second degree of planarization, which is higher than the first degree of planarization, wherein the first and second planarization layers can be removed together; bonding the support wafer and the device wafer such that the device layer and the planarized surface of the support wafer are bonded; removing the backing layer of the device wafer; and structuring the resulting structure and removing the first and second planarization layers via a common method to generate the moveable portion of the device.

The present invention is based on the knowledge that by filling in structures with the first planarization layer and depositing the second planarization layer a significant improvement of the planarity of the surface prior to a bonding step can be achieved, which leads to a significant improvement of the surface condition of the devices to be produced by the bonding process. Further, by the preferable usage of a silica glass-based material both for the first and the second planarization layer, a significant improvement during fabrication of the device can be achieved, since in that case conventional methods from semiconductor technology can be used without having to fear contamination or bubble generation. Additionally, with a preferred usage of such materials, a good adaptation of the expansion properties can be achieved, avoiding a stress load of the device layer during further processing. Particularly by the fact that the first and second planarization layers can be removed together in one process step, a further increase of the effort required for producing such a device can be avoided and such a device can be produced inexpensively. Further, the preferred usage of a suitable material for the second planarization layer enables significant leveling and chemical activation of the planarized surface prior to bonding the device wafer on this surface.

BRIEF DESCRIPTION OF THE DRAWINGS

These and other objects and features of the present invention will become clear from the following description taken in conjunction with the accompanying drawings, in which.

DESCRIPTION OF THE PREFERRED EMBODIMENTS

In the accompanying figures, equal or similar elements are provided with the same or similar reference numbers, whereby a repeated description of these elements has been omitted.

Figure 1A:
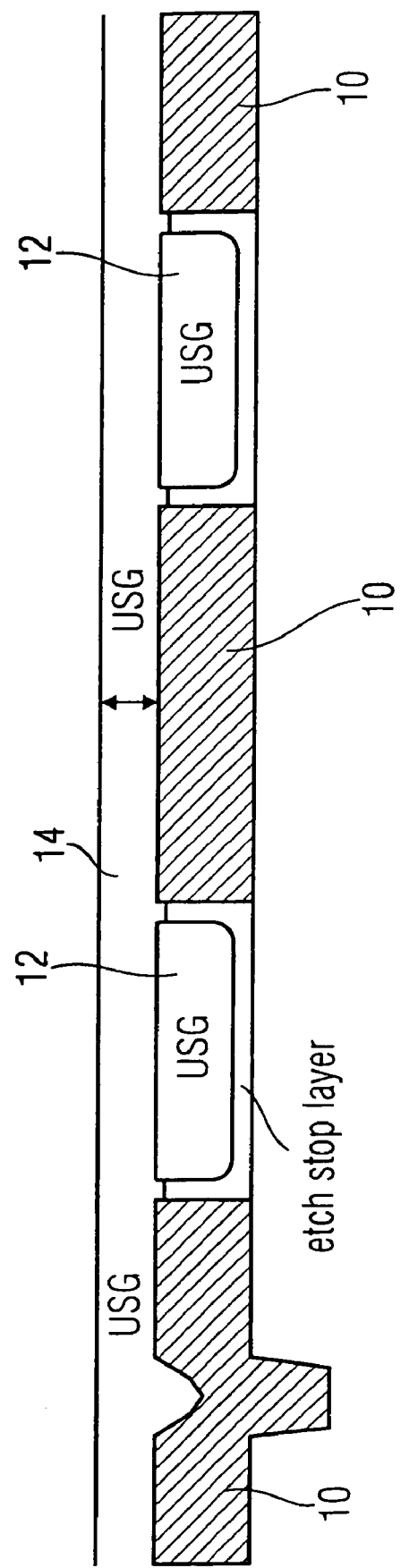
FIGS. 1A to 1H are steps of an embodiment of the inventive method.

Direct bonding via an interface layer of, for example, spin on glass enables a very strong connection with excellent long term stability. The main difficulty is to achieve a sufficiently smooth and planar surface. Generally, bonding can be achieved when the RMS surface roughness (RMS=root mean square) is better than 0.5 nanometers. First, the CMOS wafer is planarized, for example by using an oxide CMP method (CMP=chemical mechanical polishing), such as illustrated in FIG. 1A. The planarization is a two step process, where 1 μm thick electrodes 10 are first covered by a thick layer 12 of undoped silica glass USG (USG=undoped silica glass) deposited by PECVD (PECVD=plasma enhanced chemical vapor decomposition), which can then be polished back (for example onto the electrode surface). The residual non-planarity can then be reduced by deposition and polishing a different layer 14 of USG. The surface is then covered by a thin layer 16 of spin on glass SOG, which levels out surface irregularities, and a buffer layer is formed, which mitigates the stress during the bonding process (see FIG. 1B). The SOG is then baked for one hour at 400° Celsius. Together, the USG (and SOG) define the gaps between the mirrors and electrodes in the device finally to be formed. Direct bonding is then performed, for example, in a SÜSS Microtec CL 200 bonding tool, which cleans and dries the wafer surface automatically, before the wafers are brought in contact and spontaneous bonding starts (see FIG. 1C). The second wafer comprises a handling layer 18, a buried oxide layer 20, also called BOX layer (BOX=buried oxide) and a device layer 22. In order to obtain a sufficiently high connective strength for further process steps, the wafer pair is annealed for five hours at 300° Celsius. As in adhesive bonding processes, the main part of the handling layer 18 (consisting, for example, of silicon) is removed by polishing and the residual silicon as well as the BOX layer 20 are removed by spin etching (see FIG. 1D). First, the device layer 22 is structured to define the movable portions and positions for the backing posts. Then, an oxide protective layer 24 is deposited on the silicon surface of the device 22 (see FIG. 1E). Then, holes 26 are etched into the oxide and silicon layers, wherein these holes then stop on the electrodes, as illustrated in FIG. 1F. Posts 28 are then formed by using a tungsten-based chemical vapor deposition, which follows the back etching (see FIG. 1G). The usage of tungsten CVD allows a dense arrangement of mirror posts 28, which additionally offer the required strength for a good mechanical support of the mirrors. After the mirror posts 28 have been formed, mirrors 30 can be structured and finally be released (see FIG. 1H). This can, for example, be performed by a vapor etch process with hydrofluoric acid (HF) to etch oxide selectively against aluminum and silicon, so that released mirrors are formed, such as they are illustrated in FIG. 2.

Figure 1B:
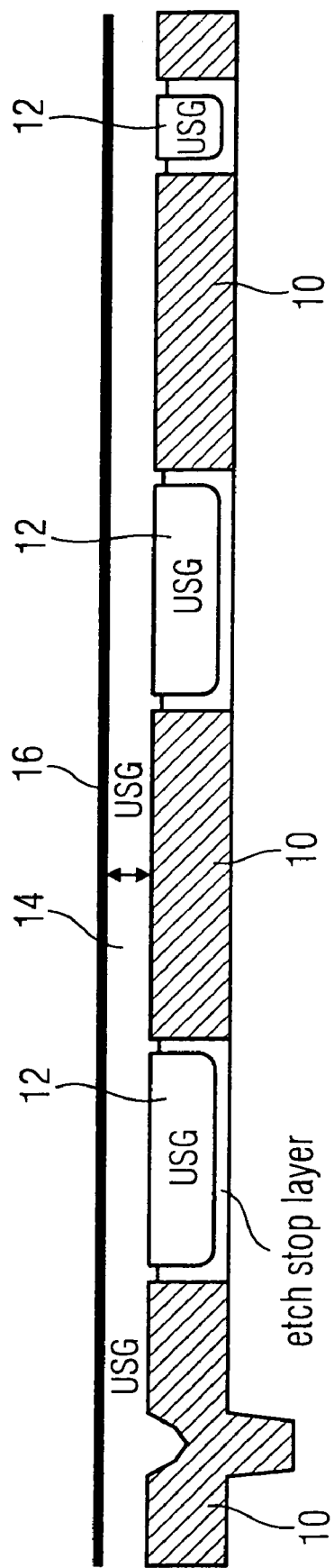
Figure 1C:
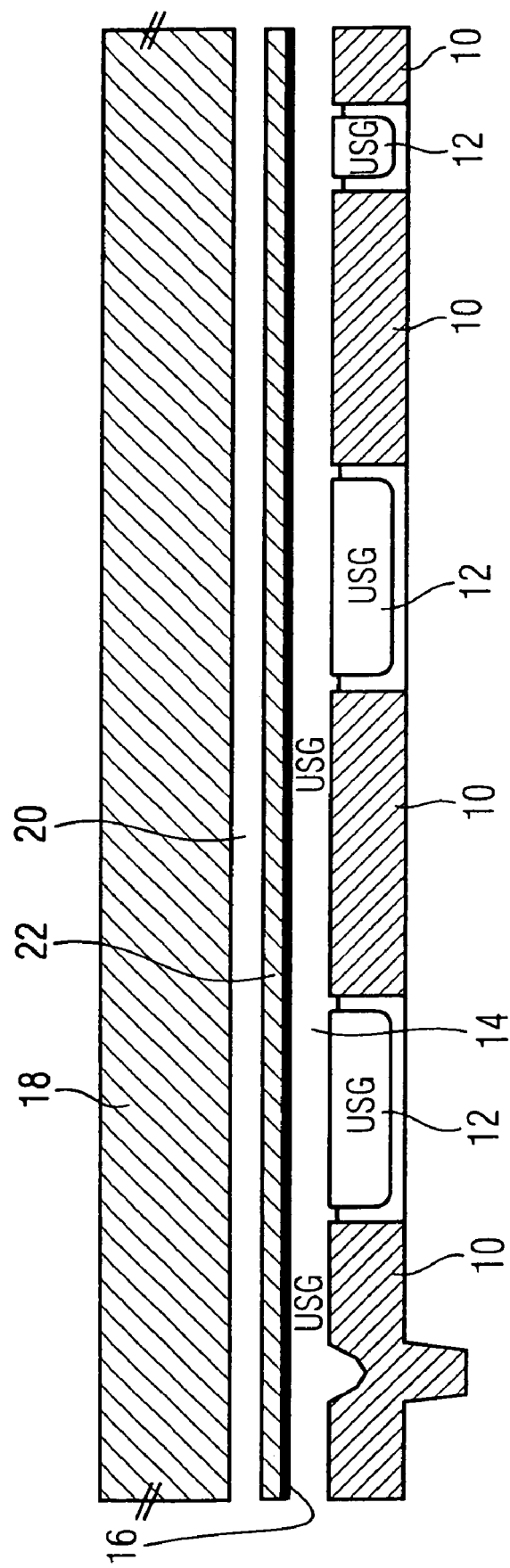
Figure 1D:
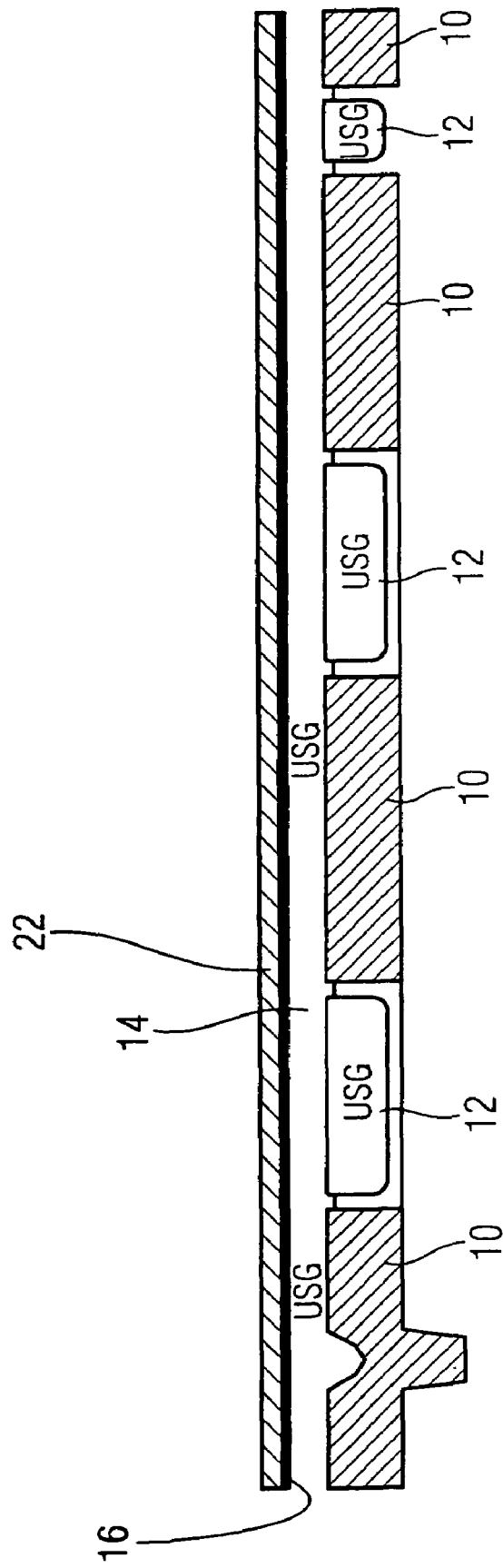
Figure 1E:
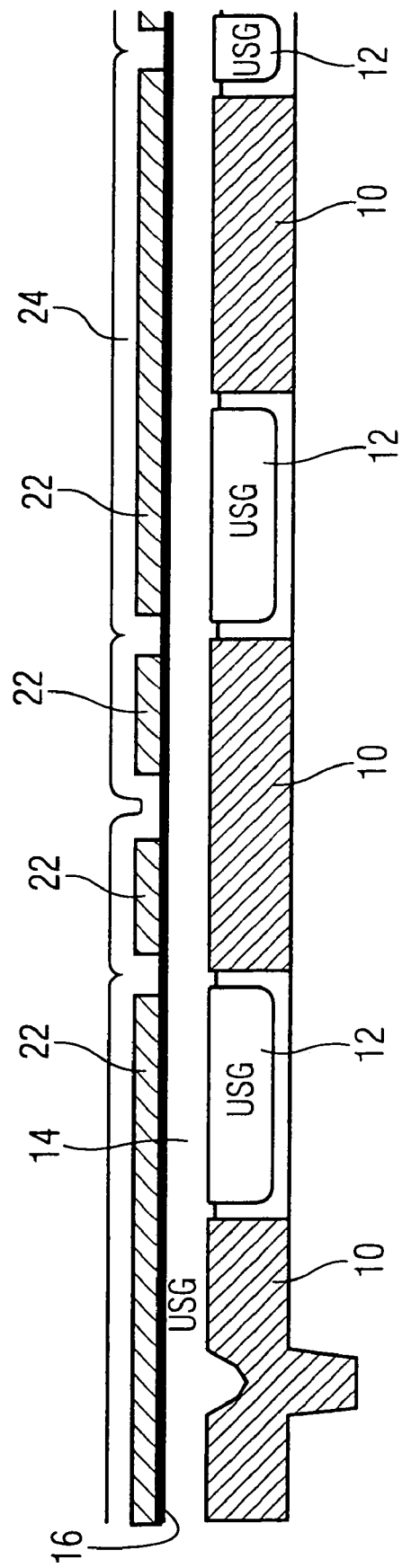
Figure 1F:
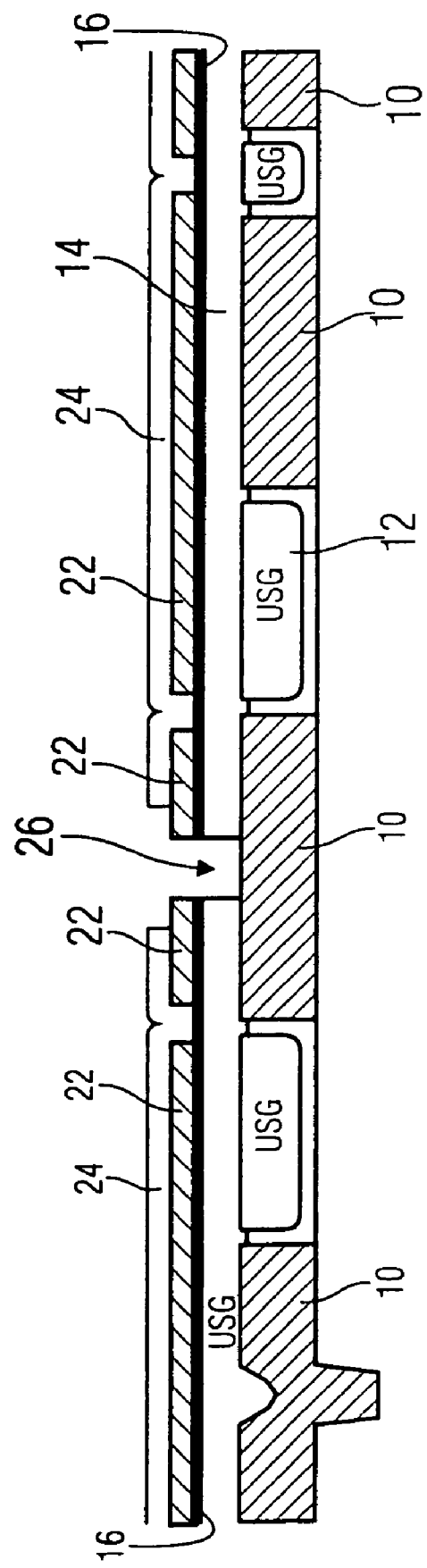
Figure 1G:
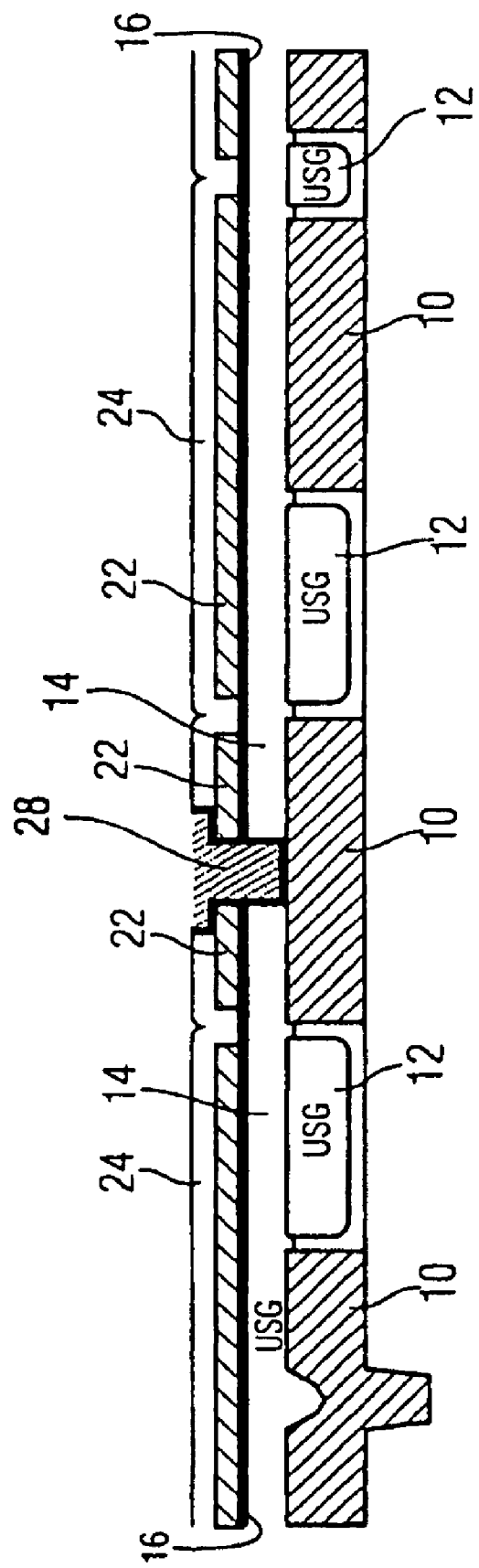
Figure 1H:
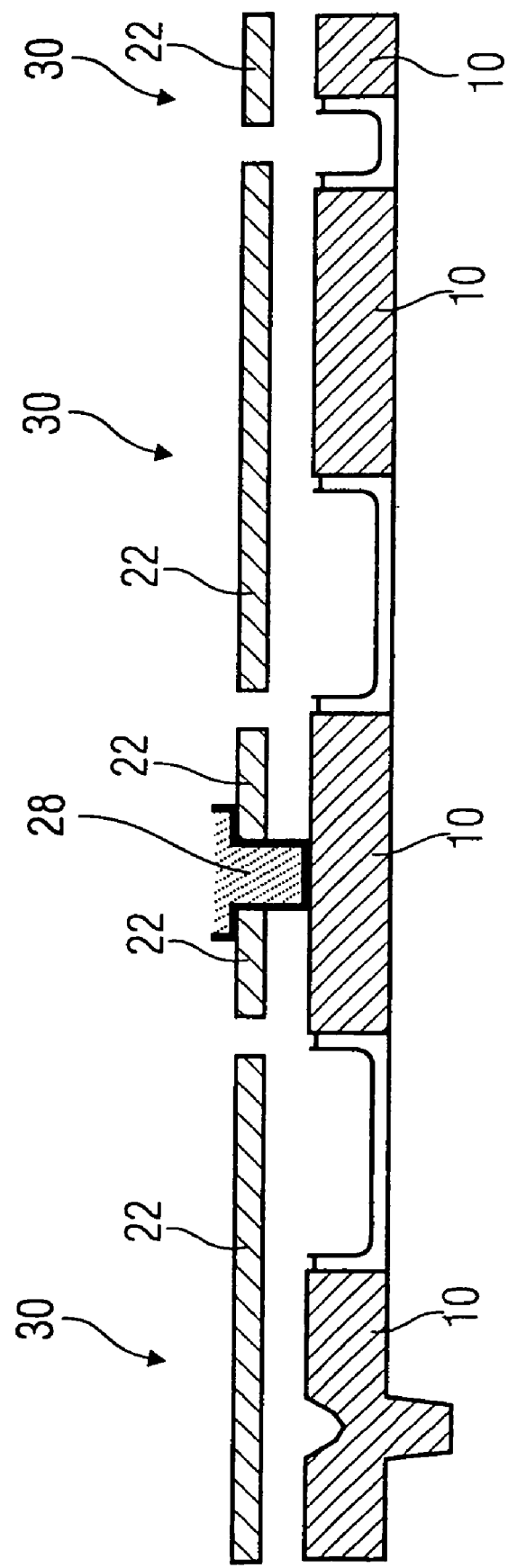
Figure 2:
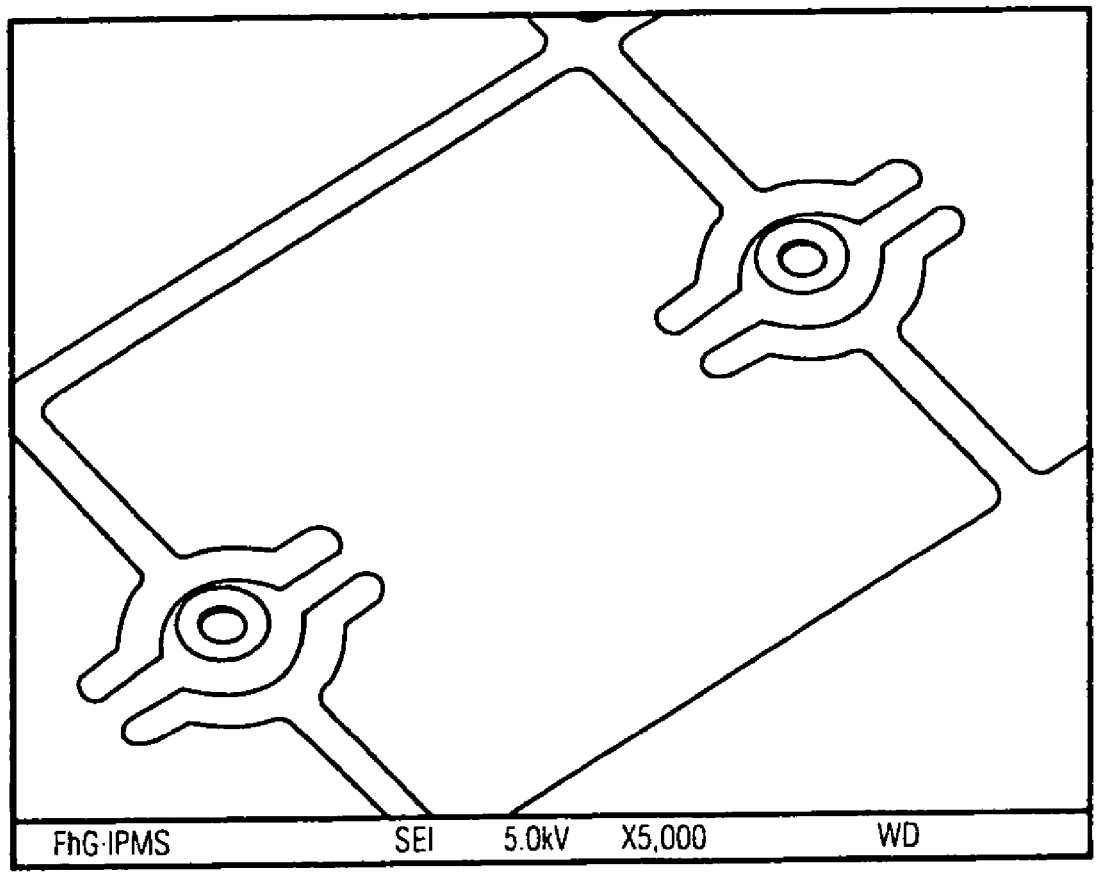
FIG. 2 is a perspective top view of an embodiment of the device generated according to the inventive method.
Figure 3A:
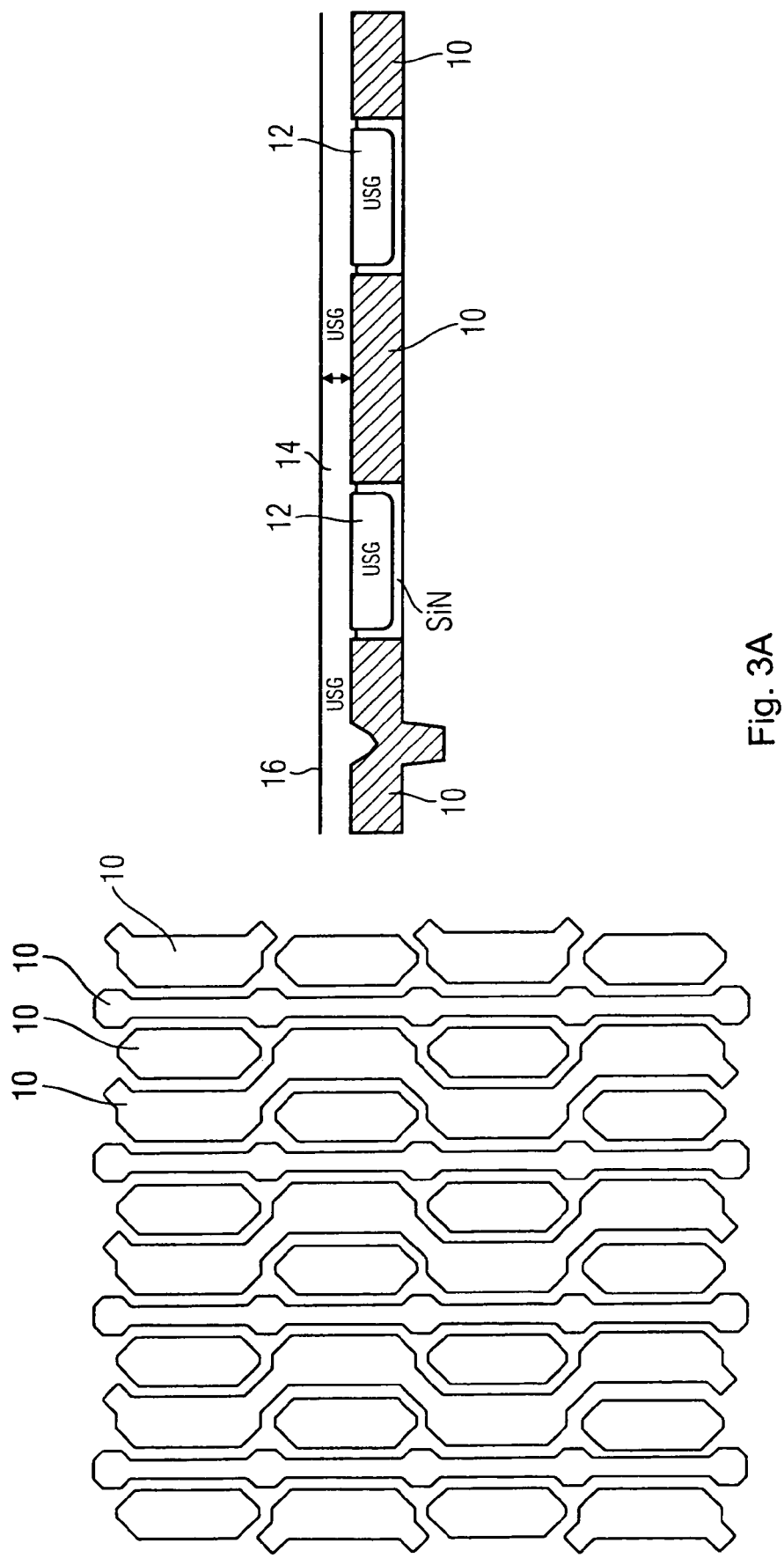
FIGS. 3A To 3G are steps of a further embodiment of the inventive method.
Figure 3B:
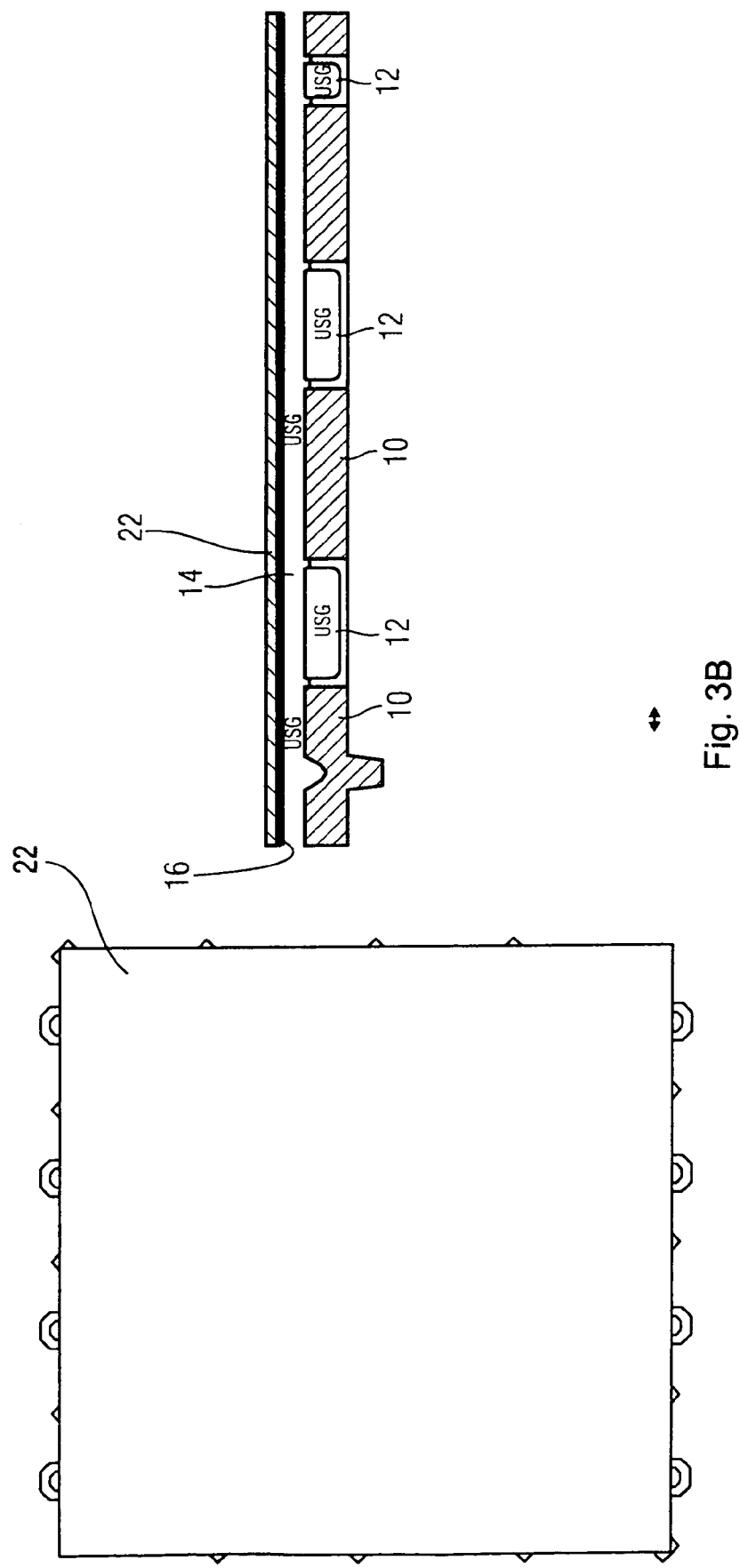
Figure 3C:
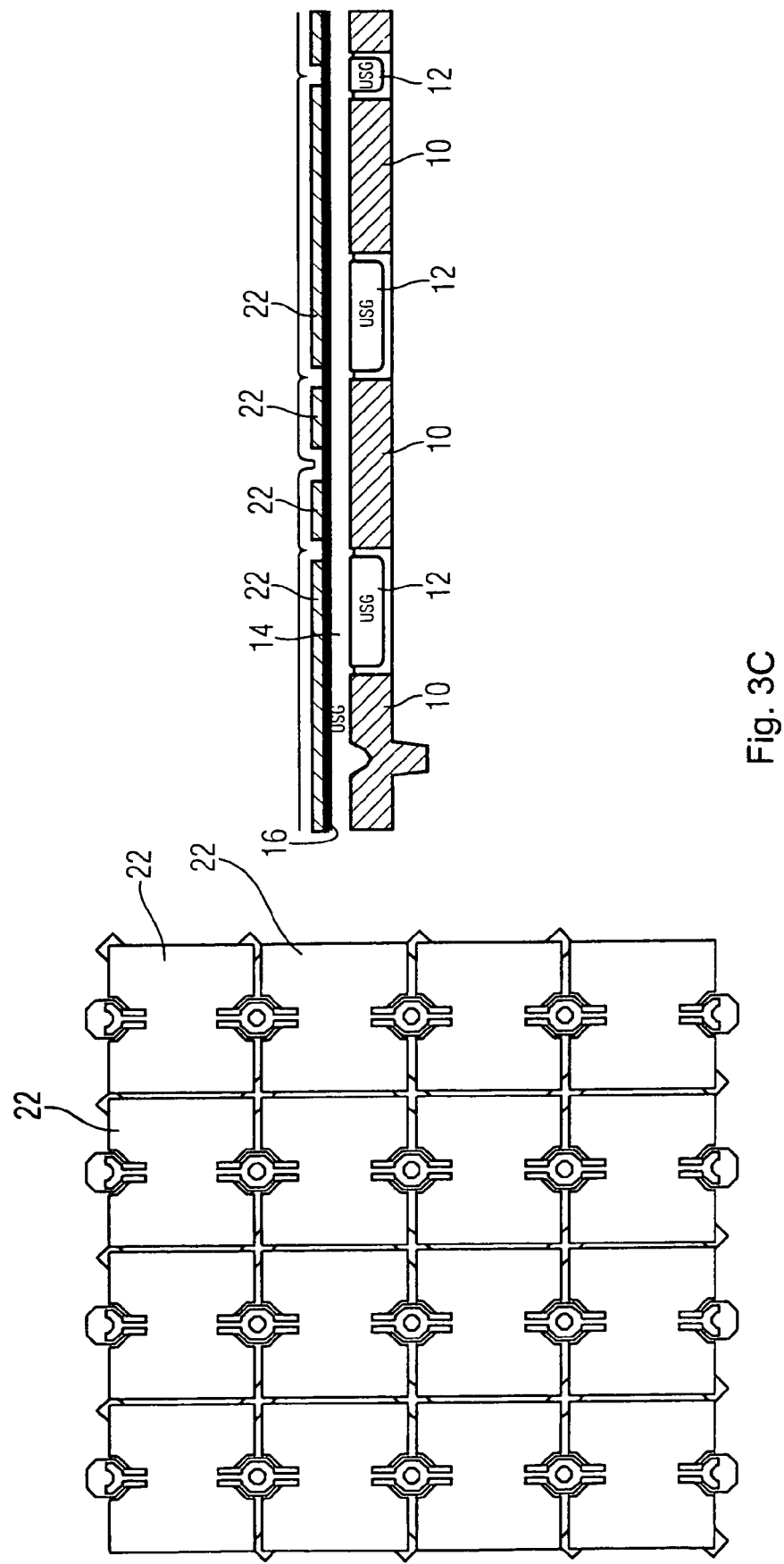
Figure 3D:
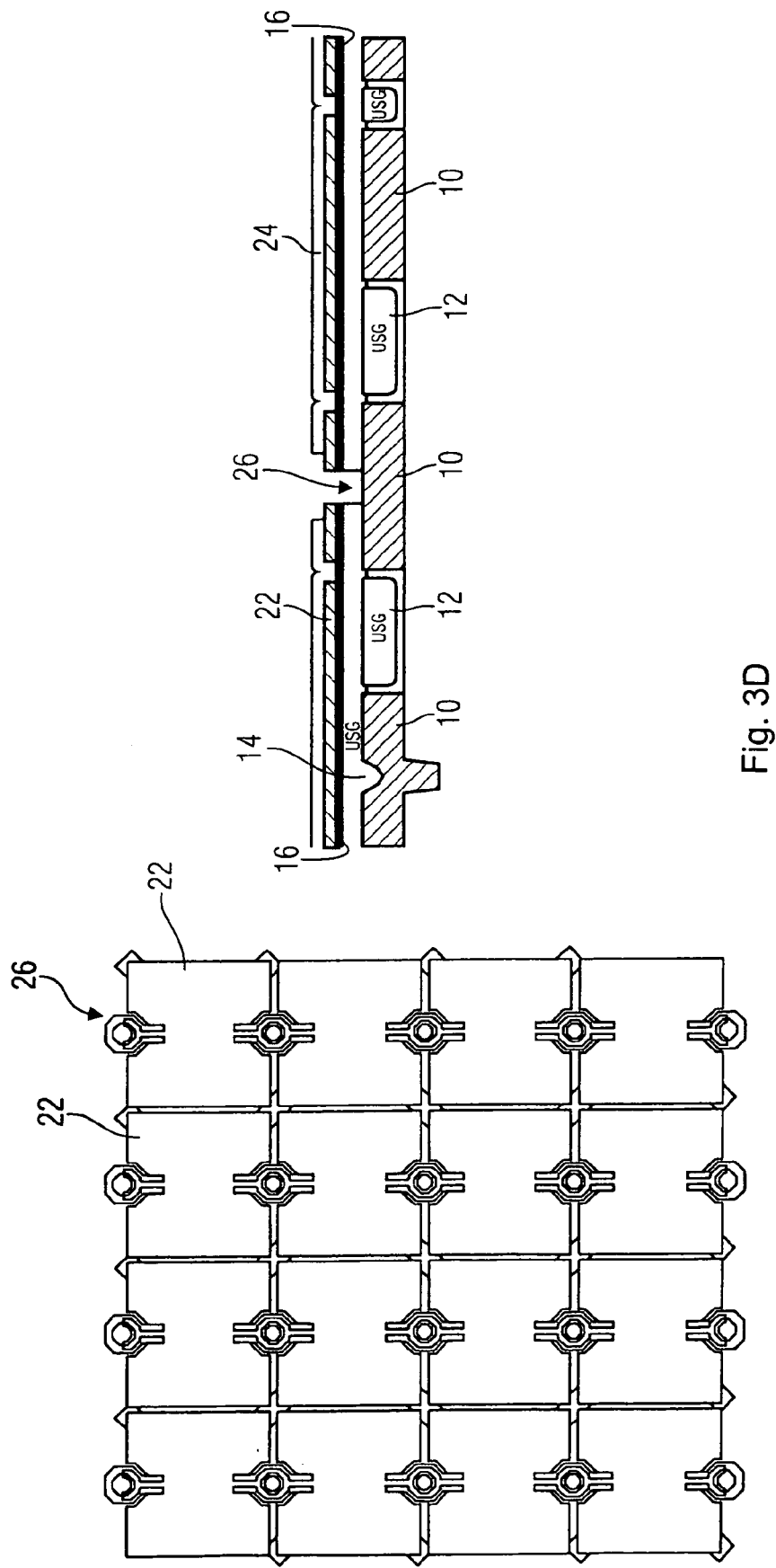
Figure 3E:
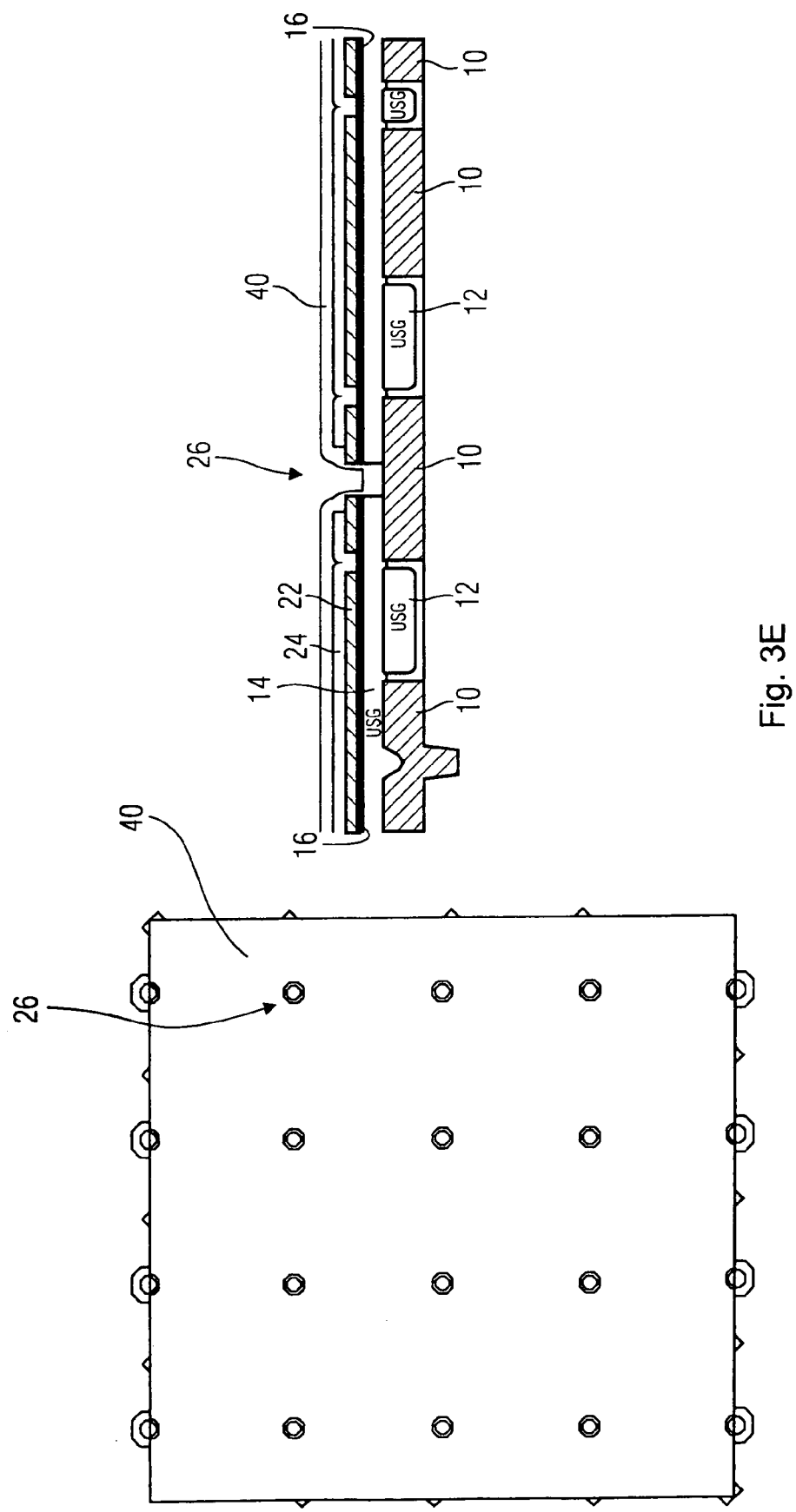
Figure 3F:
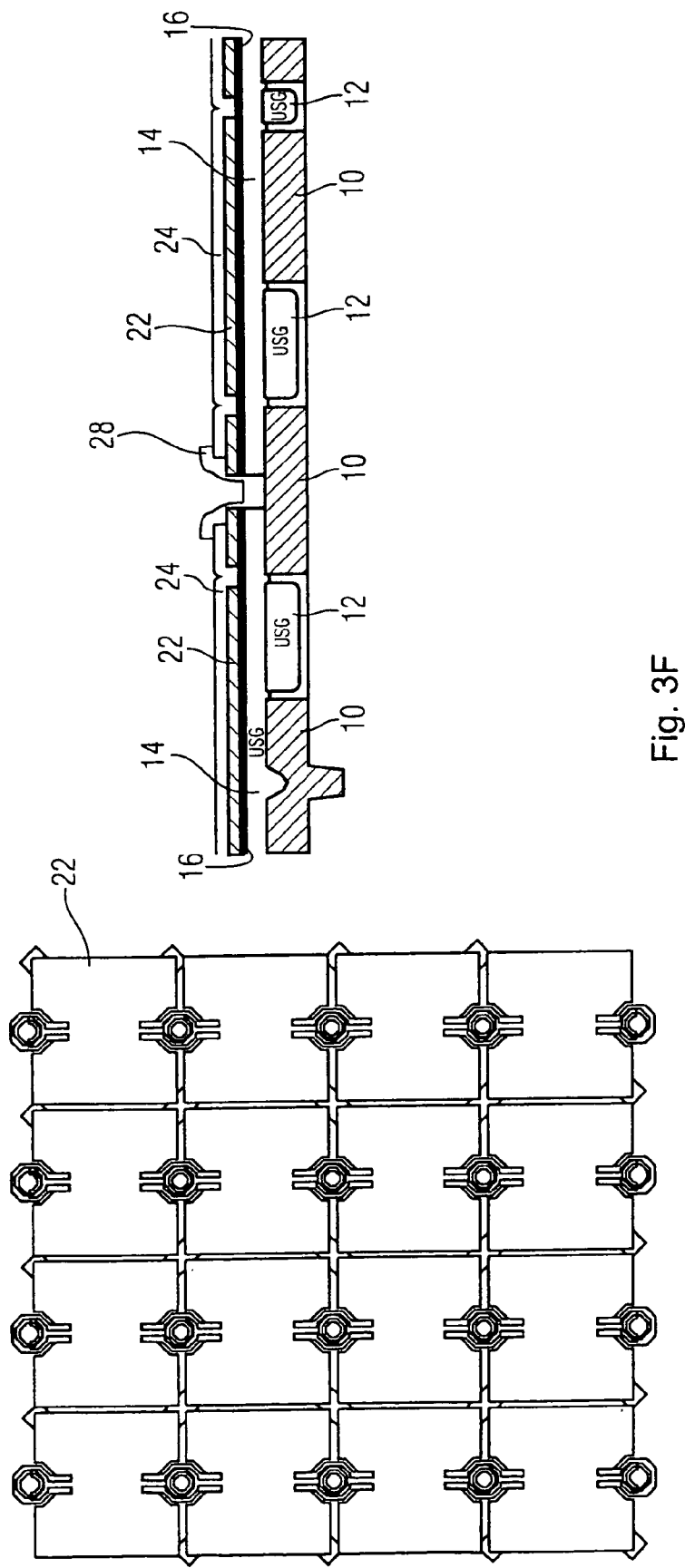
Figure 3G:
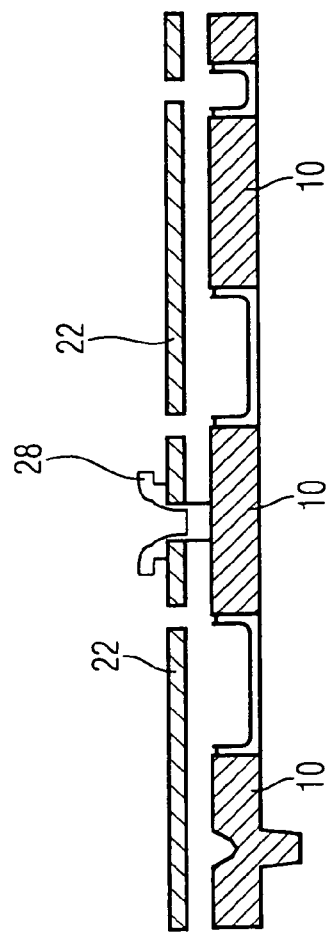
Figure 3G:
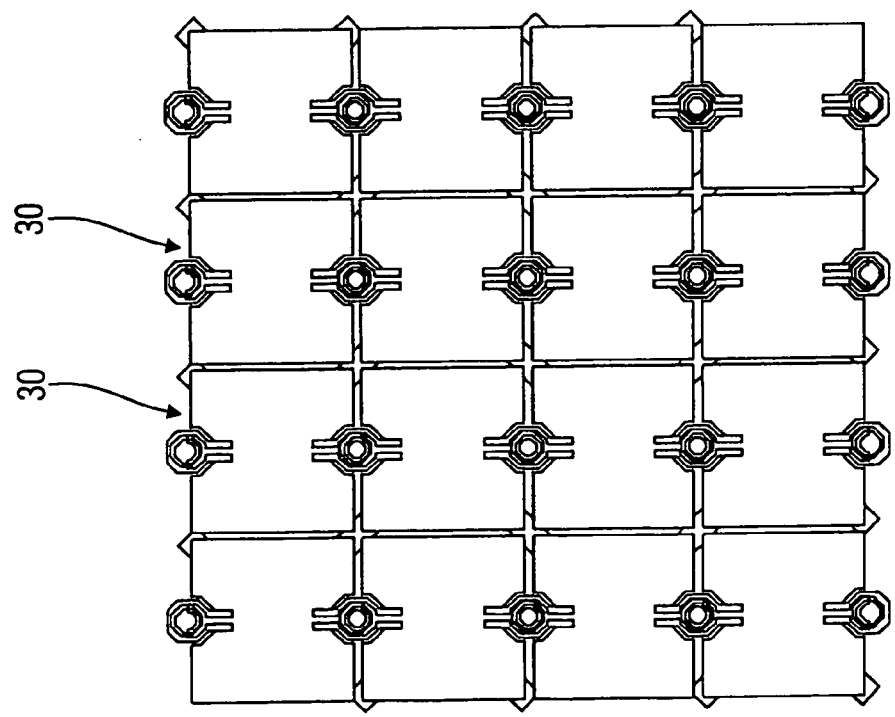

The steps illustrated in FIGS. 3A to 3G correspond to the steps illustrated in FIGS. 1A to 1H. FIGS. 3A to 3G each show a top view (left side) and a cross sectional view (right side). Further, it has to be mentioned that the steps illustrated in FIGS. 1A to 1B are combined in FIG. 3A, so that FIG. 3A shows how structure after baking. FIG. 3B shows that the SOI wafer is deposited on the USG (or bonding of the USG with the SOG, respectively), wherein grinding and spin etching are performed until the thin device silicon membrane remains. FIG. 3C illustrates how the mirrors (i.e. devices) and the contact holes are defined or etched into the silicon membrane with the stop on the USG layer. Then, holes 26 are etched into the spacer, as illustrated in FIG. 3D. Etching stops at the electrodes 10, which consist, for example, of aluminum. At the same time, flanges for improved electrical or mechanical contacting of the mirrors are formed during etching of the holes 26. Then, sputtering of aluminum (or a different metal offering an electrical connection to the electrodes) is performed, as illustrated in FIG. 3E.

Hereby, it has to be mentioned, that ion processing is possible to allow a good electrical contact to the posts. Subsequently, aluminum posts are structured and etched. The etching mask can then be removed (see FIG. 3F). Finally, the chips are diced and the spacer is removed by HF vapor etching which preferably stops on the etching stop layer.

The inventive method improves both the basic mirror planarity and the reproducibility of the corresponding elements. This is particularly due to a) the polymer spacer material (i.e. the sacrificial layer) being preferably replaced by an undoped silicon glass (USG), which can be deposited with excellent uniformity and at the same time can be polished using the CAMP method to an excellent surface planarity in the sub nanometer range, using conventional, well-known and highly reproducible processes.

b) performing a preferred substitution of the mirror material with a monocrystalline silicon, which is almost perfectly homogeneous and free from stress gradients, which would otherwise warp the mirrors.

Thus, the inventive method is based on direct bonding of a silicon on insulator wafer (SOI=silicon on insulator) to a wafer containing, for example, control electronics (for example in CMOS technology). It is a key element that the electronic wafer is planarized prior to bonding using, for example, a combination of chemical vapor deposition (CVD) of undoped silica glass (USG) and chemical mechanical polishing (CMP).

Further, it is another aspect to use, for example, for stress relief, an intermediate layer of a specific type of spin-on-glass (SAG) for smoothing out residual surface roughness and for providing a chemically active surface that bonds easily. Further, it can be shown that the handle silicon of the SOI wafer can be used by a combination of grinding and spin etching to leave merely a thin layer of monocrystalline silicon on the electronics wafer. Further, the disclosed method preferably comprises forming electrically/mechanical connections between mirrors and control electronics by using a) tungsten plugs formed by a CVD method, or b) aluminum plugs formed by sputtering, or c) a combination of a metal conductor layer and a CVD deposited material, such as amorphous silicon.

Finally, the mirrors can be released using vapor hydrofluoric acid (HF), which makes it possible to etch the preferably used sacrificial oxide (USG and SOG) with high selectivity over aluminum and silicon.

Thus, the process flow described in the above FIGS. 1A to 1H or 3A to 3G leads to the following aspects:

the fabrication of very large scale spatial light modulators based on monocrystalline silicon micromirrors with integrated control electronics, such as in CMOS technology, becomes possible;

a high yield can be gained by a method of attaching an ultra-thin monocrystalline silicon thin film can be used to deposit the same on a CMOS wafer on wafer level;

the fabrication of a mirror matrix is enabled, which requires no alignment of two wafers to be bonded (except a crude alignment of the wafer flats prior to bonding);

a bonding process that can be carried out at atmospheric pressure in tools allowing cleaning immediately prior to the bonding step and thus practically eliminating the problem of particle contamination;

the use of purely inorganic materials throughout the entire fabrication process is possible, whereby standard and thus well-known fabrication methods and compatible fabrication methods in semiconductor industry can be used, in contrary to eutectic bonding with gold or tin or adhesive bonding based on polymers;

a low temperature wafer bonding method can be used, which is within the temperature limit of a CMOS process (i.e. less than 400° C.; the temperature of 300° C. was used in the present invention);

the use of chemical mechanical polishing (CMP) combined with the use of a specific spin on glass (SOG) intermediate layer is possible, whereby the surface roughness can be reduced to less than 0.5 nanometers (RMS), which is sufficient to allow automatic bonding of the two wafers due to attraction by Van Deer Wails force;

the use of SAG acting as stress relief layer during wafer bonding, reducing the build-up of stress in the monocrystalline silicon film;

the elimination of surface activation, such as performing an oxide plasma treatment is possible, because the SOG layer contains sufficient bonds to ensure good chemical bonding when the wafers are joined and annealed (particularly by forming hydrogen bridges);

the method allows the use of tungsten-CVD or aluminum sputter method or a combination of a sputter method and a CVD for forming the plugs, so that good electrical or mechanical connections are ensured between the mirrors and the electronics. This is possible since the surface is perfectly sealed (i.e. no open areas that attract unwanted deposits are present). Further, a USG sacrificial layer can be used, which ensures that a very stable bond with high connection strength is formed, whereby a CVD method becomes possible at temperatures which are merely limited by the process steps of CMOS technology (i.e. up to 400° C.);

the release of the moveable structures (particularly when forming the devices as micromirrors) can be performed by using vapor hydrofluoric acid (HF) vapor etching, which etches the glass and leaves the silicon mirrors and the aluminum electrodes undamaged. It has been shown that by careful adaptation of the etching process, the glass sacrificial layer can be removed without bond between the mirror and the base.

In summary, it has to be stated that the inventive method is superior to the prior art particularly in that the producibility of monocrystalline silicon micromirrors on, for example, a CMOS circuit, can be increased.

While this invention has been described in terms of several preferred embodiments, there are alterations, permutations, and equivalents, which fall within the scope of this invention. It should also be noted that there are many alternative ways of implementing the methods and compositions of the present invention. It is therefore intended that the following appended claims be interpreted as including all such alterations, permutations, and equivalents as fall within the true spirit and scope of the present invention.

What is claimed is:

1. A method of producing a device with a moveable portion disposed spaced apart from a support wafer, comprising:

generating a first planarization layer of a first starting material on a support wafer having a structured surface using a first method to fill in the structures of the structured surface of the support water, whereby a surface of the support wafer with a first degree of planarization is obtained;

generating a second planarization layer of a second starting material on the planarized surface of the support wafer using a second method to obtain a planarized surface of the support wafer with a second degree of planarization, which is higher than the first degree of planarization, wherein the first and second planarization layers can be removed together;

bonding the support wafer having the planarized surface and a device wafer with a backing layer and a device layer disposed thereon such that the device layer and the planarized surface of the support wafer are bonded;

removing the backing layer of the device wafer; and structuring the bonded structure and removing the first and second planarization layers via a common method to generate the moveable portion of the device.

2. The method according to claim 1, wherein the first method is a vapor deposition method or a sputter method of depositing the first planarization layer, wherein the first starting material comprises a silicon dioxide-based material.

3. The method according to claim 1, wherein the first method comprises first and second process steps, wherein filling in the structures of the structure surface is performed in the first process step and depositing a smoothing layer on the structures filled in by the first process step is performed in the second process step.

4. The method according to claim 1, wherein the first method comprises chemical mechanical polishing for obtaining the surface with the first degree of planarization.

5. The method according to claim 1, wherein the second method is a spin-on method, wherein the second starting material comprises a silicon dioxide-based material.

6. The method according to claim 4, wherein the second method comprises heating of the second planarization layer.

7. The method according to claim 1, wherein different inorganic materials are used as first and second starting materials.

8. The method according to claim 1, wherein the step of bonding comprises bonding under atmospheric pressure and cleaning the planarized surface or an released surface of the device layer prior to bringing the planarized surface into contact with the released surface of the device layer.

9. The method according to claim 1, wherein the step of removing comprises vapor etching with hydrofluoric acid.

10. The method according to claim 1, wherein structuring comprises forming backing posts between the device layer and a structured surface of the support wafer obtained by structuring the bonded structure.

11. The method according to claim 10, wherein forming the backing posts comprises opening the device layer, the first and second planarization layers as well as filling the opening with tungsten, aluminum or another conductive material.

12. The method according to claim 1, wherein the structuring comprises defining the moveable portion of the device.

13. The method according to claim 1, comprising producing a plurality of devices with a movable portion.

14. The method according to claim 1, wherein the device is formed as micromirror.

* * * * *